United States Patent
Wu et al.

(10) Patent No.: US 7,026,647 B2
(45) Date of Patent: Apr. 11, 2006

(54) DEVICE AND METHOD FOR DETECTING ALIGNMENT OF ACTIVE AREAS AND MEMORY CELL STRUCTURES IN DRAM DEVICES

(75) Inventors: Tie Jiang Wu, Ilan (TW); Chien-Chang Huang, Hsinchu (TW); Bo Ching Jiang, Hualien (TW); Yu-Wei Ting, Taipei (TW); Chin-Ling Huang, Shulin (TW)

(73) Assignee: Nanya Technology Corporation, Taoyuan (TW)

( * ) Notice: Subject to any disclaimer, the term of this patent is extended or adjusted under 35 U.S.C. 154(b) by 107 days.

(21) Appl. No.: 10/673,310

(22) Filed: Sep. 29, 2003

(65) Prior Publication Data

US 2004/0082087 A1 Apr. 29, 2004

(30) Foreign Application Priority Data

Oct. 25, 2002 (TW) ................................ 91125197 A

(51) Int. Cl.
*H01L 23/58* (2006.01)
(52) U.S. Cl. .......................................... 257/48; 438/14
(58) Field of Classification Search .................. 438/14, 438/17; 257/48
See application file for complete search history.

(56) References Cited

U.S. PATENT DOCUMENTS

| 5,576,223 | A | * | 11/1996 | Zeininger et al. | ............... | 438/5 |
| 5,977,558 | A | * | 11/1999 | Lee | ............... | 257/48 |
| 6,028,324 | A | * | 2/2000 | Su et al. | ............... | 257/48 |
| 6,429,452 | B1 | * | 8/2002 | Jarvis | ............... | 257/48 |
| 2004/0153275 | A1 | * | 8/2004 | Wang | ............... | 702/117 |

* cited by examiner

*Primary Examiner*—Caridad Everhart
(74) *Attorney, Agent, or Firm*—Quintero Law Office

(57) ABSTRACT

A test device and method for detecting alignment of active areas and memory cell structures in DRAM devices with vertical transistors. In the test device, parallel first and second memory cell structures disposed in the scribe line region, each has a deep trench capacitor and a transistor structure. An active area is disposed between the first and second memory cell structures. The active area overlaps the first and second memory cell structures by a predetermined width. First and second conductive pads are disposed on both ends of the first memory cell structures respectively, and third and fourth conductive pads are disposed on both ends of the first memory cell structures respectively.

4 Claims, 4 Drawing Sheets

DEVICE AND METHOD FOR DETECTING ALIGNMENT OF ACTIVE AREAS AND MEMORY CELL STRUCTURES IN DRAM DEVICES

BACKGROUND OF THE INVENTION

1. Field of the Invention

The present invention relates to test devices, and more particularly, to a test device for detecting alignment of active areas and memory cell structures in DRAM devices with vertical transistors, as well as a test method thereof.

2. Description of the Related Art

With the wide application of integrated circuits (ICs), several kinds of semiconductor devices with higher efficiency and lower cost are presently produced based on different objectives, making DRAM an important semiconductor device in the information and electronics industry.

Most DRAM carries one transistor and one capacitor in a single DRAM cell. The memory capacity of the DRAM can reach 256 MB. Therefore, with increased integration it is necessary to reduce the size of memory cells and transistors to accommodate DRAM with higher memory capacity and processing speed. A 3-D capacitor structure can reduce the occupied area on the semiconductor substrate, such as with a deep trench capacitor, and is applicable to the fabrication of the DRAM with capacity of 64 MB and above.

As compared with a traditional plane transistor, however, this structure covers many areas of the semiconductor substrate and cannot satisfy the demands of high integration. Therefore, a vertical transistor which can save space is important in structuring a memory unit.

The adjacent memory cells may experience current leakage and cell failure, reducing process yield, if active area masks and memory cell structures are not aligned accurately. Therefore, process yield and reliability of the memory cells can be improved if alignment accuracy between the masks of active areas and memory cell structures is controlled within an acceptable range.

SUMMARY OF THE INVENTION

It is therefore an object of the present invention to detect alignment of active areas and memory cell structures in DRAM devices with vertical transistors.

According to the above mentioned object, the present invention provides a test device and method for detecting alignment of active areas and memory cell structures in DRAM devices with vertical transistors.

In the test device of the present invention, parallel first and second memory cell structures disposed in the scribe line region, each has a deep trench capacitor and a transistor structure. An active area is disposed between the first memory and second memory cell structures. The active area overlaps the first and second memory cell structures by a predetermined width. First and second conductive pads are disposed on both ends of the first memory cell structure respectively, and third and fourth conductive pads are disposed on both ends of the first memory cell structures respectively.

According to the present invention, a method for detecting alignment of active areas and memory cell structures in DRAM devices with vertical transistors includes the following steps. First, a wafer with at least one scribe line region and at least one memory region is provided. Then, a plurality of memory cells in the memory region and at least one test device in the scribe line region are formed simultaneously. A first resistance between the first and second conductive pads disposed on the first memory cell structure is measured. A second resistance between the third and fourth conductive pads disposed on the second memory cell structure is measured. Next, alignment of the active area and the first and second memory cell structures is determined according to the first resistance and the second resistance. Finally, alignment of the active area and the memory cells in the memory region is determined according to alignment of the active area and the first and second memory cell structures of the test device.

BRIEF DESCRIPTION OF THE DRAWINGS

The present invention can be more fully understood by the subsequent detailed description and examples with reference made to the accompanying drawings, wherein.

DETAILED DESCRIPTION OF THE INVENTION

In the present invention, at least one test device 200 is formed in the scribe line region, while a plurality of memory cells with vertical transistors is formed in the memory regions on a wafer simultaneously. The plurality of memory cells formed in the memory region is shown in FIG. 1 and FIG. 2 and the test device 200 is shown in FIG. 3.

Figure 1:
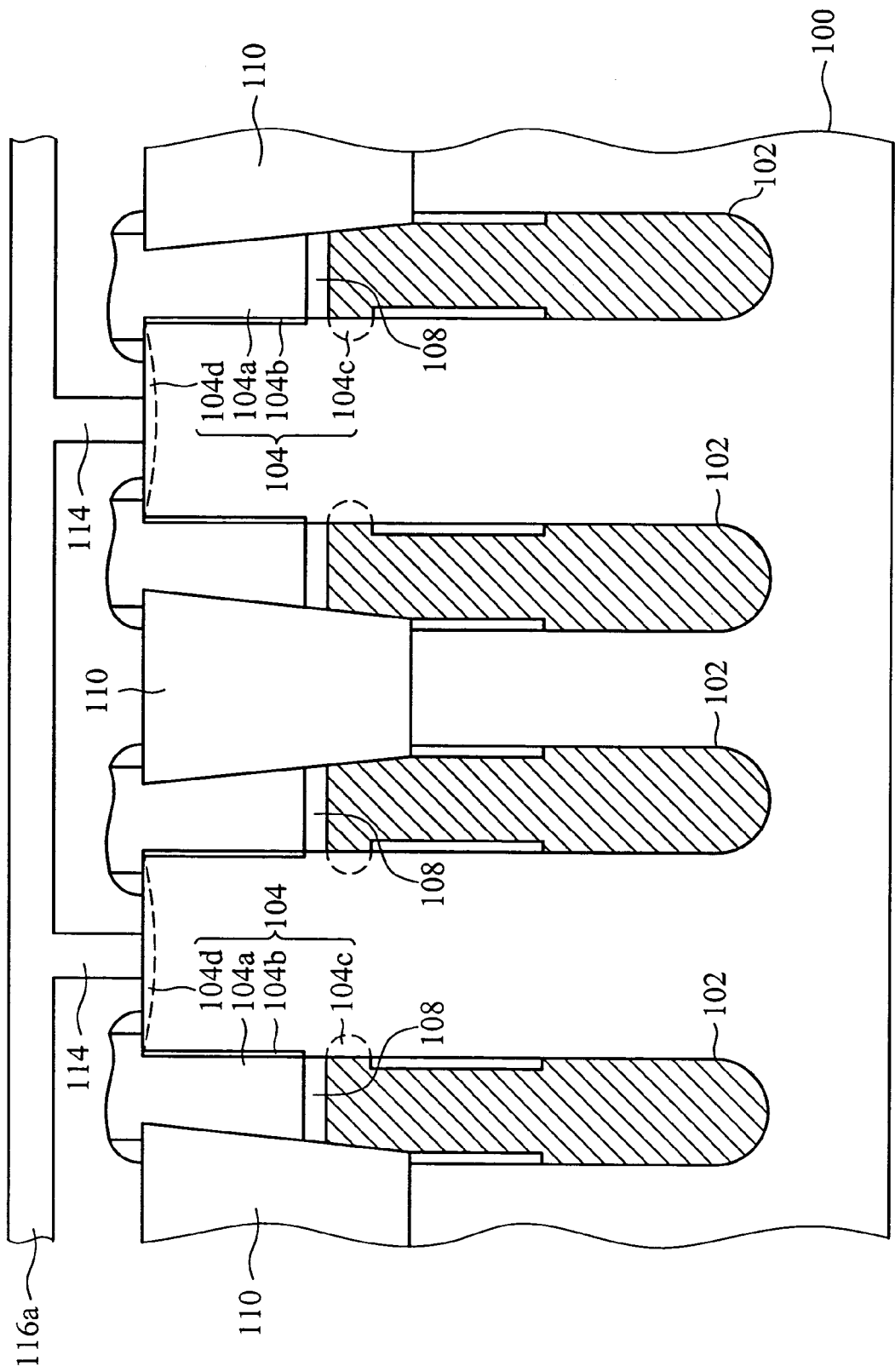
FIG. 1 is a cross section of a memory device with vertical transistors.

As shown in FIG. 1, deep trench capacitors 102 are formed into a matrix and disposed in the substrate 100. Each deep trench capacitor 102 has a vertical transistor 104 disposed thereon. Each vertical transistor 104 includes a gate 104a, a gate oxide layer 104b, a source 104c and a common drain 104d. The gate oxide layer 104b is the sidewall at the bottom of the gate 104a, and the vertical region between the source 104c and the common drain 104d in the substrate 100 is the channel of the transistor 104.

Figure 2:
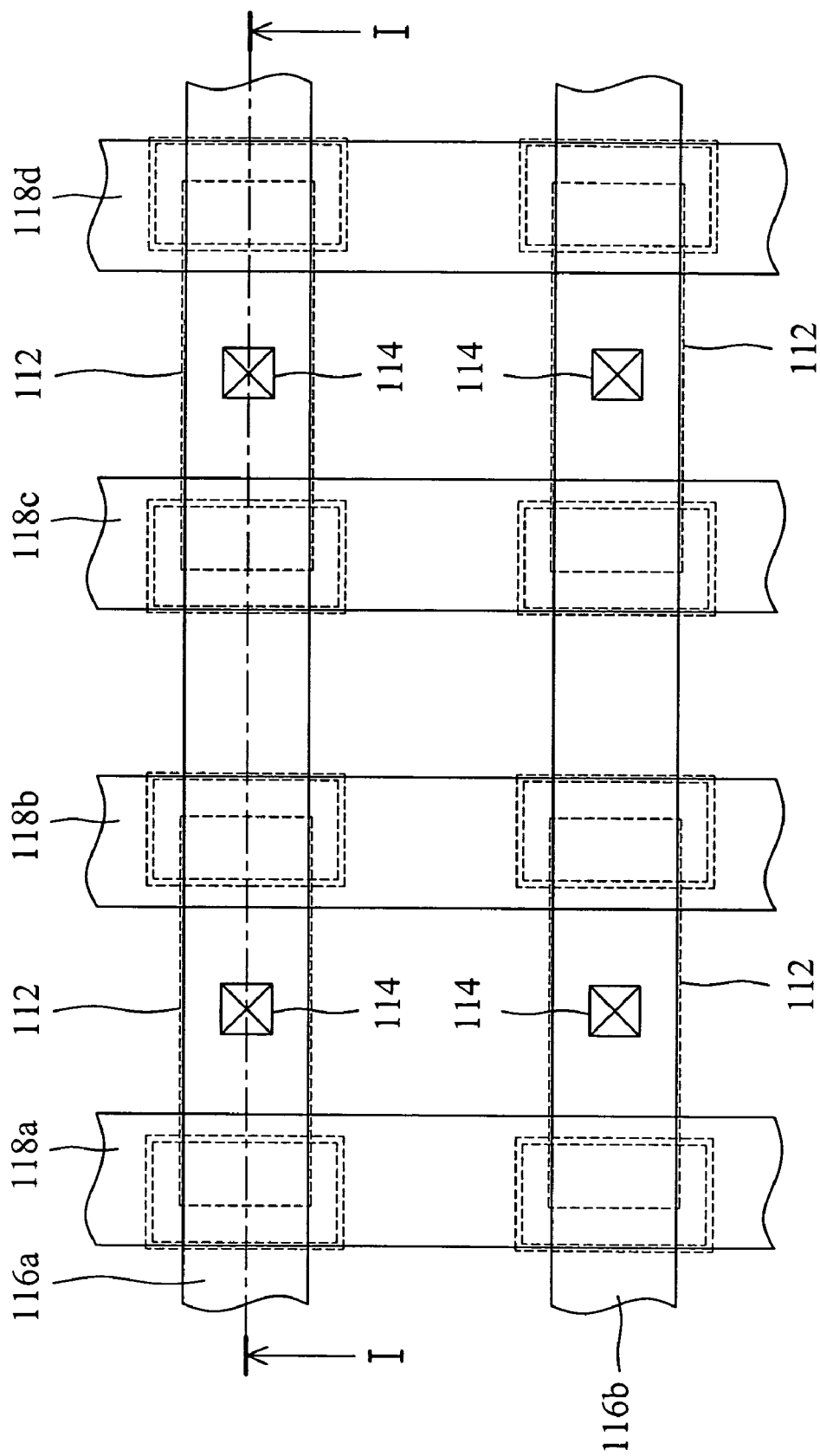
FIG. 2 is a layout of the memory device as shown in FIG. 1.

As shown in FIG. 2, word lines 118a, 118b, 118c and 118d are disposed above the active area 112 as the gate 104a of the transistor 104 (not shown). Command drains 104d are disposed above the active areas 112 between adjacent word lines 118a and 118b or 118c and 118d. Bit lines 116a and 116b are perpendicular to word lines 118a~118d, and are electrically coupled to the command drains through bit line contacts 114.

Figure 3:
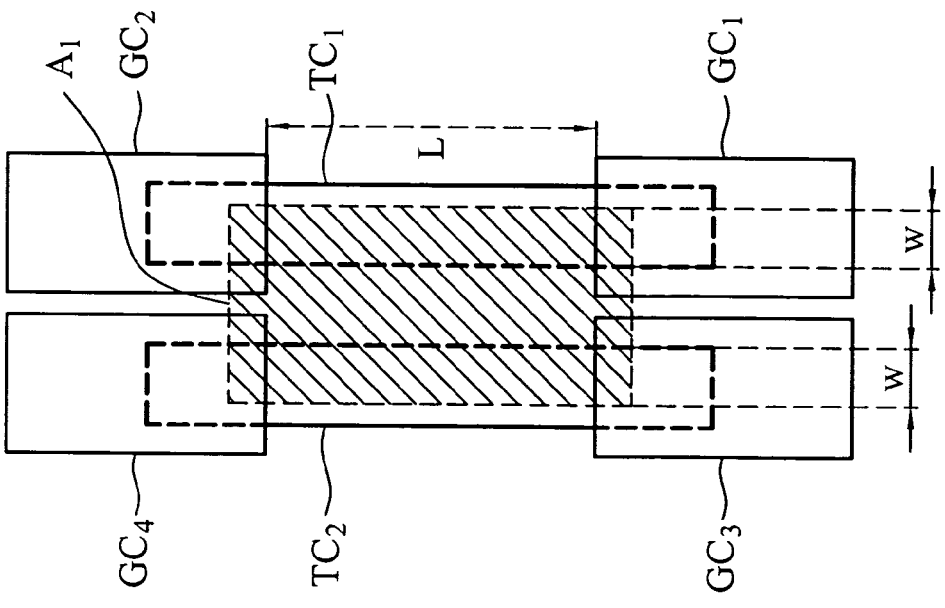
FIG. 3 is a layout of the test device according to the present invention.

FIG. 3 is a layout of the test device of the present invention. The test device 200 detects the alignment of active areas and memory cell structures in DRAM devices with vertical transistors, wherein the test device 200 is disposed in a scribe line region of a wafer (not shown).

In test device 200 shown in FIG. 3, parallel first and second memory cell structures $TC_1$ and $TC_2$ are disposed in the scribe line region (not shown), each has a deep trench capacitor and a transistor structure. An active area $A_1$ is disposed between the first memory cell structure $TC_1$ and the second memory cell structures $TC_2$. The active area $A_1$ overlaps the first and second memory cell structures ($TC_1$ and $TC_2$) a predetermined overlap width W. First and second conductive pads (GC$_1$ and GC$_2$) are disposed on both ends of the first memory cell structures TC$_1$ respectively, and third and fourth conductive pads (GC$_3$ and GC$_4$) are disposed on both ends of the first memory cell structures TC$_2$ respectively.

In the present invention, two parallel deep trenches in the scribe line region and a plurality of deep trenches in the memory region are formed simultaneously. Then, the parallel first and second memory cell structures TC$_1$ and TC$_2$ are formed in the two parallel deep trenches and the memory cells with vertical transistors are formed in the deep trenches in the memory region simultaneously. The parallel first and second memory cell structures TC$_1$ and TC$_2$, each has a deep trench capacitor and a transistor structure.

Next, active areas 112 in the memory region and an active area A$_1$ in the scribe line region are formed simultaneously with the same process and conditions. The active area A$_1$ is formed between the memory cell structures TC$_1$ and TC$_2$, and overlaps the memory cell structures TC$_1$ and TC$_2$ by a predetermined overlap width W respectively.

The word lines 118a~118b of the memory cells in the memory regions and the first to fourth conductive pads GC$_1$~GC$_4$ on the memory cell structures TC$_1$ and TC$_2$ are formed simultaneously with the same masks, process and conditions. The first and second conductive pads GC$_1$ and GC$_2$ are disposed on both ends of the first memory cell structure TC$_1$ respectively. The third and fourth conductive pads GC$_3$ and GC$_4$ are disposed on both ends of the second memory cell structure TC$_2$ respectively. The first to fourth conductive pads and the bar-type conductive pad are made of the same material, such as polysilicon. The first and second conductive pads GC$_1$ and GC$_2$ are electrically coupled to the transistor structure (gate) under the deep trench capacitor of the first memory cell structure TC$_1$ respectively. The third and fourth conductive pads GC$_3$ and GC$_4$ are electrically coupled to the transistor structure (gate) under the deep trench capacitor of the second memory cell structures TC$_2$ respectively. In addition, the first conductive pad GC$_1$ are a predetermined distance L from the second conductive pad GC$_2$, and the third conductive pad GC$_1$ are the predetermined distance L from the fourth conductive pad GC$_4$.

Figure 4:
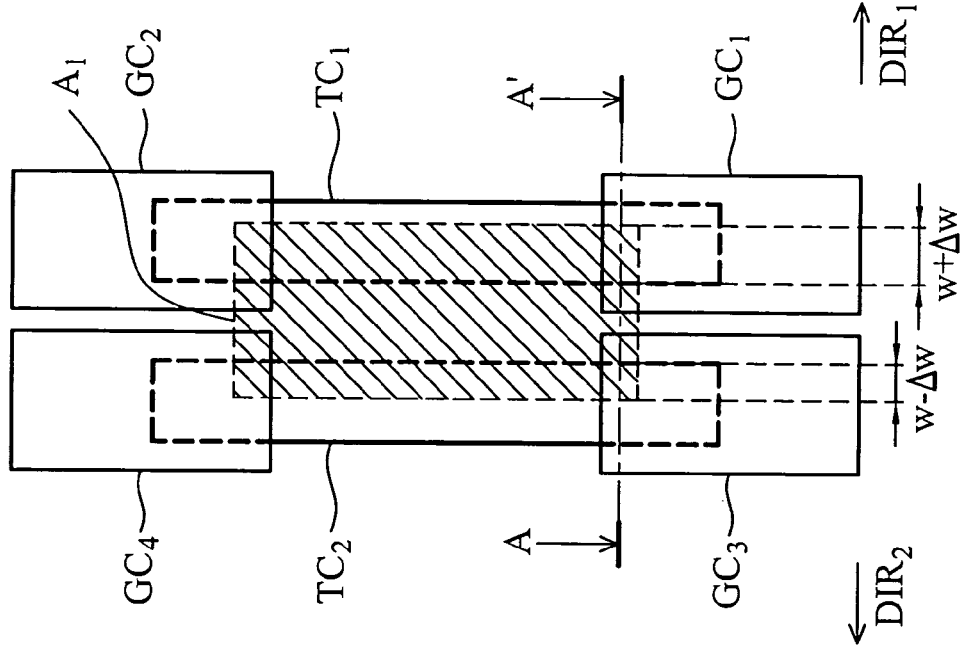
FIG. 4 is another layout of the test device with alignment shift according to the present invention.
Figure 5:
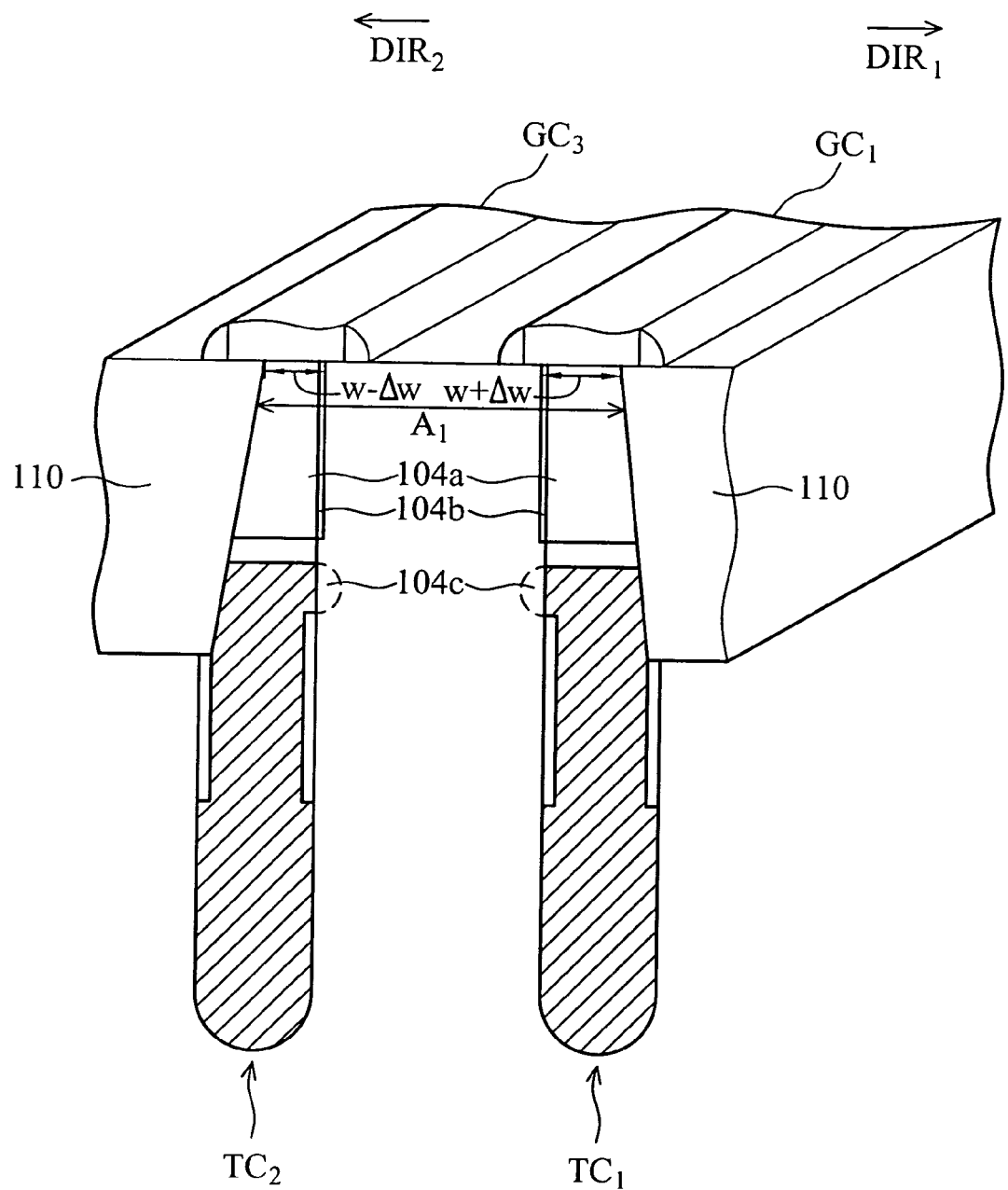
FIG. 5 is a cross section of the test device according to the present invention.

With reference to FIG. 4 and FIG. 5, normally, a first resistance R$_1$ between the first conductive pad GC$_1$ and the second conductive pad GC$_2$ on both ends of the first memory cell structure TC$_1$ can be detected. A second resistance R$_2$ between the third conductive pad GC$_3$ and the fourth conductive pad GC$_4$ on both ends of the second memory cell structure TC$_2$ can be detected. The first resistance R$_1$ and the second resistance R$_2$ can be obtained according to equations 1 and 2.

$$R_1 = R_{CT} \times \frac{L}{W + \Delta W}; \quad (1)$$

$$R_2 = R_{CT} \times \frac{L}{W - \Delta W}; \quad (2)$$

Wherein R$_{CT}$ is the resistance per surface area of memory cell structures (TC$_1$ and TC$_2$), L is the predetermined distance between the first and second conductive pads (GC$_1$ and GC$_2$) and between the third and fourth conductive pads (GC$_3$ and GC$_4$) respectively, W+$\Delta$W is the overlap width between the active area A$_1$ and the first memory cell structure TC$_1$, and W−$\Delta$W is the overlap width between the active area A$_1$ and the second memory cell structure TC$_2$.

Using the same process, material and conditions, equations 3 and 4 can be achieved according to the equations 1 and 2.

$$\frac{R_1}{R_2} = \frac{W - \Delta W}{W + \Delta W}; \quad (3)$$

$$\Delta W = W \times \frac{R_2 - R_1}{R_2 + R_1}; \quad (4)$$

Thus, the alignment shift $\Delta W$ between the active area A$_1$ and the first and second memory cell structure TC$_1$ and TC$_2$ can be obtained if the first resistance R$_1$ and the second resistance R$_2$ are measured. That is to say, the alignment shift $\Delta W$ of the active area A$_1$ and the first and second memory cell structures (TC$_1$ and TC$_2$) is zero when the first resistance R$_1$ equals the second resistance R$_2$.

With reference to FIG. 4 and FIG. 5, the active area A$_1$ is shifted by a distance $\Delta W$ along the direction DIR$_1$ if the masks of the first and second memory cell structure (TC$_1$ and TC$_2$) and the active area A$_1$ have an alignment shift $\Delta W$ in the direction DIR$_1$. If this condition is met, the first resistance R$_1$ is smaller than the second resistance R$_2$ according to the equations 1 and 2. Moreover, the alignment shift $\Delta W$ can be obtained according to the equation 4.

On the contrary, the active area A$_1$ is shifted by a distance $\Delta W$ along the direction DIR$_2$ if the masks of the first and second memory cell structures (TC$_1$ and TC$_2$) and the active area A$_1$ have an alignment shift $\Delta W$ in the direction DIR$_2$. If this condition is met, the first resistance R$_1$ is larger than the second resistance R$_2$ according to the equations 1 and 2. Moreover, the alignment shift can be obtained according to the equation 4.

In the present invention, the test device 200 disposed in the scribe line region and a plurality of memory cells with vertical transistors in the memory region are formed simultaneously. For example, the deep trench capacitor and transistor structure of the memory cells in the memory region and the deep trench capacitor and transistor structure of the memory cell structures (TC$_1$ and TC$_2$) in the scribe line region are formed simultaneously with the same masks, process and conditions. The active areas 112 of the memory cells in the memory region and the active area A$_1$ of the test device 200 are formed simultaneously with the same masks, process and conditions. Therefore, the memory region and the test device may have the same alignment shift between memory cell structures (TC$_1$ and TC$_2$) and active areas (112 and A$_1$) use of the same masks and the same process. Thus, alignment of memory cell structures and active areas in the memory region can be obtained according to whether the first resistance R$_1$ equals the second resistance R$_2$.

The present invention also provides a method for detecting alignment of memory cell structures and active areas in memory devices with vertical transistors. In the method of the present invention, a wafer with at least one scribe line region and at least one memory region is provided.

A plurality of memory cells with vertical transistors in the memory region and at least one test device in the scribe line region are formed simultaneously, wherein each memory cell has a deep trench capacitor and a corresponding transistor structure (memory cell structure) as shown in FIG. 1 and FIG. 2. The structure of the test device 200 is shown in FIG. 3. The memory cell structure in the memory regions and the memory cell structure (TC$_1$ and TC$_2$) in the test device 200 are formed by the same mask and the same process. The active areas 112 in the memory regions and the active area $A_1$ in the test device 200 are formed with the same mask and process.

Next, a first resistance $R_1$ between the first conductive pad $GC_1$ and the second conductive pad $GC_2$ on both ends of the first memory cell structure $TC_1$ is determined. A second resistance $R_2$ between the third conductive pad $GC_3$ and the fourth conductive pad $GC_4$ on both ends of the second memory cell structure $TC_2$ is determined. Then, alignment of the active area $A_1$ and the first and second memory cell structures $TC_1$ and $TC_2$ of the test device 200 is determined according to whether the first resistance $R_1$ is equal to the second resistance $R_2$.

The memory region and the test device may have the same alignment shift between active areas ($A_1$ and 112) and memory cell structures ($TC_1$ and $TC_2$) use the same masks and the same process. Thus, alignment of active areas and memory cell structures in the memory region can be obtained according to whether the first resistance $R_1$ equals the second resistance $R_2$. The alignment shift between active areas and memory cell structures in the memory regions can also be obtained according to the equation 4.

Further, in the present invention the test device is disposed in the scribe line region to avoid occupying layout space.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A test device for detecting alignment of active areas and memory cell structures in DRAM devices with vertical transistors, wherein the test device is disposed in a scribe line region of a wafer, comprising:
    parallel first and second memory cell structures disposed in the scribe line region, each having a deep trench capacitor and a vertical transistor structure formed in a substrate;
    an active area disposed between the first and second memory cell structures, wherein the active area overlaps the first and second memory cell structures a predetermined width; and
    first to fourth conductive pads disposed on both ends of the first and second memory cell structures respectively.

2. The test device as claimed in claim 1, wherein a first resistance is measured by the first and second conductive pads disposed on both ends of the first memory cell structure, and a second resistance is measured by the third and fourth conductive pads disposed on both ends of the second memory cell structure, and alignment shift ($\Delta W$) of the active area and the first and second memory cell structures is estimated according to the first resistance, the second resistance, and the predetermined width.

3. The test device as claimed in claim 1, wherein the first to fourth conductive pads are made of polysilicon.

4. The test device as claimed in claim 1, wherein the wafer further has a memory region including a plurality of memory cells with vertical transistors.

* * * * *